(12) United States Patent
Lee

(10) Patent No.: US 7,029,942 B2
(45) Date of Patent: Apr. 18, 2006

(54) METHOD FOR FABRICATING COMPLEMENTARY METAL OXIDE SEMICONDUCTOR IMAGE SENSOR

(75) Inventor: Won-Ho Lee, Ichon-shi (KR)

(73) Assignee: MagnaChip Semiconductor, Ltd., (KR)

( * ) Notice: Subject to any disclaimer, the term of this patent is extended or adjusted under 35 U.S.C. 154(b) by 120 days.

(21) Appl. No.: 10/746,106

(22) Filed: Dec. 24, 2003

(65) Prior Publication Data

US 2004/0185595 A1 Sep. 23, 2004

(30) Foreign Application Priority Data

Mar. 13, 2003 (KR) .................. 10-2003-0015648

(51) Int. Cl.
*H01L 21/00* (2006.01)
(52) U.S. Cl. .................. 438/48; 438/57; 438/200
(58) Field of Classification Search ............ 438/48, 438/57, 59, 200
See application file for complete search history.

(56) References Cited

U.S. PATENT DOCUMENTS

| | | | |
|---|---|---|---|
| 6,661,045 B1* | 12/2003 | Ishiwata | 257/290 |
| 6,897,082 B1* | 5/2005 | Rhodes et al. | 438/48 |
| 2004/0178430 A1* | 9/2004 | Rhodes et al. | 257/292 |

* cited by examiner

*Primary Examiner*—Tuan H. Nguyen
(74) *Attorney, Agent, or Firm*—Blakely Sokoloff Taylor & Zafman

(57) ABSTRACT

The present invention relates to a method for fabricating a complementary metal oxide semiconductor (CMOS) image sensor. The method includes the step of: (a) forming a substrate of a first conductive type defined with a photodiode region and a native second conductive channel transistor region; and (b) forming a first conductive type impurity region by performing an ion-implantation process for forming a second conductive type channel stop region with a first conductive impurity ion, wherein the first conductive type impurity region is extended to the native second conductive type channel transistor region.

10 Claims, 2 Drawing Sheets

METHOD FOR FABRICATING COMPLEMENTARY METAL OXIDE SEMICONDUCTOR IMAGE SENSOR

FIELD OF THE INVENTION

The present invention relates to a method for fabricating a complementary metal oxide semiconductor (CMOS) image sensor; and, more particularly, to a method for fabricating a CMOS image sensor capable of improving characteristics of a native N-channel metal oxide semiconductor (NMOS) transistor.

DESCRIPTION OF RELATED ARTS

Generally, a complementary metal oxide semiconductor (CMOS) image sensor is a semiconductor device that converts an optical image into an electric signal. The CMOS image sensor includes a photo-detection unit for detecting a light and a logic circuit for processing the detected light into an electric signal, which is, in turn, converted into a corresponding datum. The CMOS technology adopts a switching mode, wherein outputs are sequentially detected by using MOS transistors made with the same number as that of pixels.

The CMOS image sensor is classified into a pixel region and a peripheral region. Particularly, a pixel array is formed in the pixel region, while N-channel metal oxide semiconductor (NMOS) and P-channel metal oxide semiconductor (PMOS) transistors are formed in the peripheral region. As shown in FIG. 1, a unit pixel in the pixel array includes one photodiode PD which is a device for collecting light and four transistors such as a transfer transistor Tx, a reset transistor Rx, a drive transistor Dx and a select transistor Sx. In more detail, the transfer transistor Tx transfers the collected light at the photodiode PD to a floating diffusion node F. The reset transistor Rx sets the floating diffusion node F with an intended electric potential value and then resets the floating diffusion node F with an electric potential value by discharging the photo-generated electric charge. The drive transistor Dx serves as a source follower buffer amplifier, and the select transistor Sx selectively outputs the electric potential value corresponding to the photo-generated electric charge. Also, there is a capacitance Cfd in the floating diffusion node (F), and a load transistor for reading the output signal exists outside of the unit pixel.

Herein, the NMOS transistor in the peripheral region is a normal NOMS transistor. The transfer transistor and the reset transistor Tx and Rx are NOMS transistors in a low threshold voltage or in a depletion mode. The drive transistor and the select transistor Dx and Sx are NOMS transistors in a typical enhancement mode. Thus, the transfer transistor Tx and the reset transistor Rx are formed as native MOS transistors without a p-well. In contrast, p-wells are formed in the NMOS transistor in the peripheral region and in active regions of the drive transistor and the select transistor Dx and Sx.

FIG. 2 is a cross-sectional view of a conventional CMOS image sensor. FIG. 2 shows only a photodiode and a transfer transistor Tx, which is a native NMOS transistor.

As shown, a trench is formed with a predetermined depth on a substrate 10 by using a hard mask made of nitride. Herein, the substrate 10 is doped with a high concentration of a p-type impurity, and an epitaxial layer doped with a low concentration of a p-type impurity is formed in the substrate 10. Then, an ion-implantation process is performed to form an N-channel stop region 100 by using the hard mask. At this time, boron ions are used. Hereinafter, such ion-implantation process for forming the N-channel stop region 100 is referred to as the N-channel stop ion-implantation process. Particularly, the N-channel stop ion-implantation process is performed such that the N-channel stop region 100 encompasses the trench. Also, the N-channel stop region 100 is formed to improve characteristics of an image sensor related to dark currents, leakage currents and a breakdown voltage. After the formation of the N-channel stop region 100, an oxide layer is deposited on a substrate structure until being filed into the trench. A chemical mechanical polishing (CMP) process is then performed to planarize the deposited oxide layer and thus to form a filed oxide layer 11 having a shallow trench isolation (STI) structure.

Subsequently, a gate insulation layer 12 and a gate 13 are sequentially formed in an active region of the substrate 10. A deep N⁻ impurity region 14 is formed in a photodiode region of the substrate 10 by employing a first mask and a first ion-implantation processes both for forming a photodiode. Afterwards, first p0 impurity ions are ion-implanted onto a surface of the deep N⁻ impurity region 14 by employing a second mask and a second ion-implantation processes both for forming the photodiode. A gate spacer 15 is formed on sidewalls of the gate 13. Next, second p0 impurity ions are ion-implanted onto the surface of the deep N⁻ impurity region 14 by performing a third ion-implantation process for forming the photodiode, so that a p0 impurity region 16 is formed on the surface of the deep N⁻ impurity region 14.

However, the above described conventional method of forming the photodiode is complicated since the photodiode is formed by performing the mask process twice and the ion-implantation process three times. Also, the boron ions typically used for forming the N-channel stop region induces a nitride channeling phenomenon under an energy level less than about 25 KeV to thereby restrict the applicable conditions related to an ion-implantation energy. As a result, it is difficult to improve characteristics of the native NMOS transistor.

SUMMARY OF THE INVENTION

It is, therefore, an object of the present invention to provide a method for fabricating a complementary metal oxide semiconductor (CMOS) image sensor capable of improving characteristics of a native N-channel metal oxide semiconductor (NMOS) transistor and realizing a cost effective and simplified photodiode fabrication process.

In accordance with an aspect of the present invention, there is provided a method for fabricating a complementary metal oxide semiconductor (CMOS) image sensor, including the steps of: (a) forming a substrate of a first conductive type defined with a photodiode region and a native second conductive channel transistor region; and (b) forming a first conductive type impurity region by performing an ion-implantation process for forming a second conductive type channel stop region with a first conductive impurity ion, wherein the first conductive type impurity region is extended to the native second conductive type channel transistor region.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Hereinafter, a preferred embodiment of the present invention will be described in detail with reference to the accompanying drawings.

Figure 1:
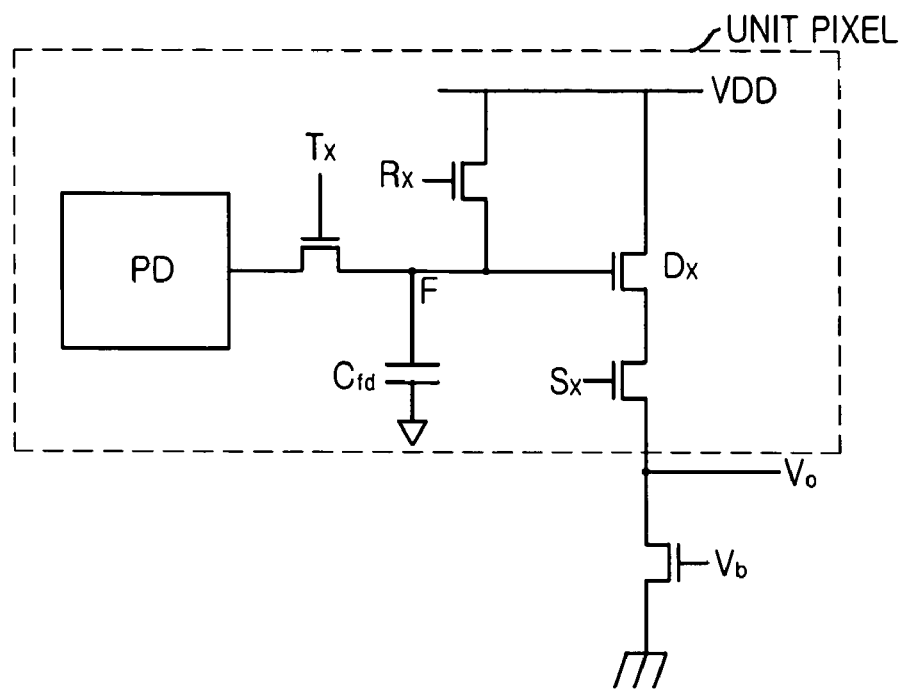
FIG. 1 is a circuit diagram of a unit pixel of a conventional complementary metal oxide semiconductor (CMOS) image sensor.
Figure 2:
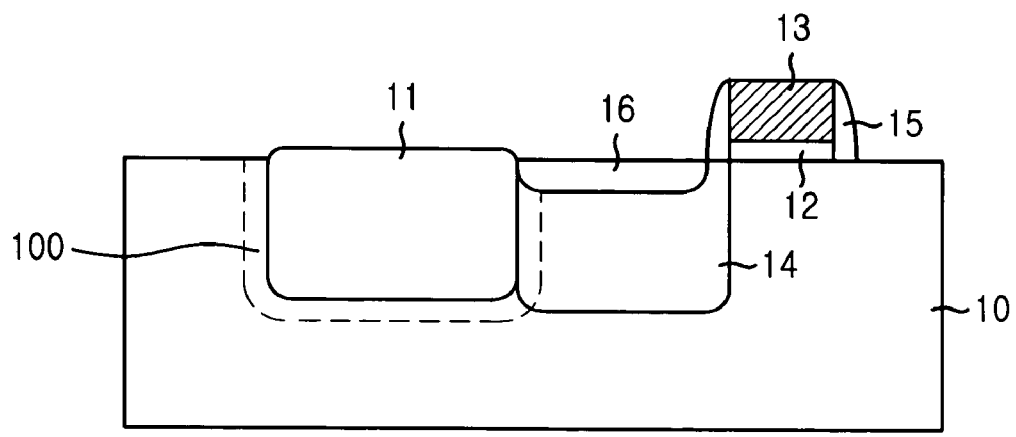
FIG. 2 is a cross-sectional view of a conventional CMOS image sensor.
Figure 3A:
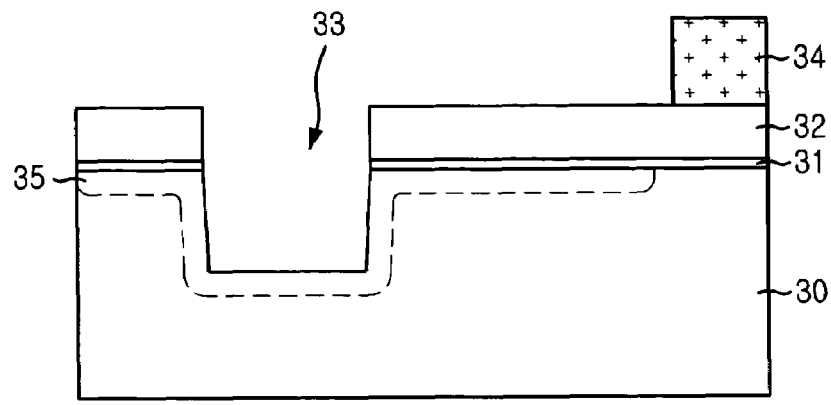
FIGS. 3A to 3C are cross-sectional views illustrating a method for fabricating a CMOS image sensor in accordance with a preferred embodiment of the present invention.
Figure 3B:
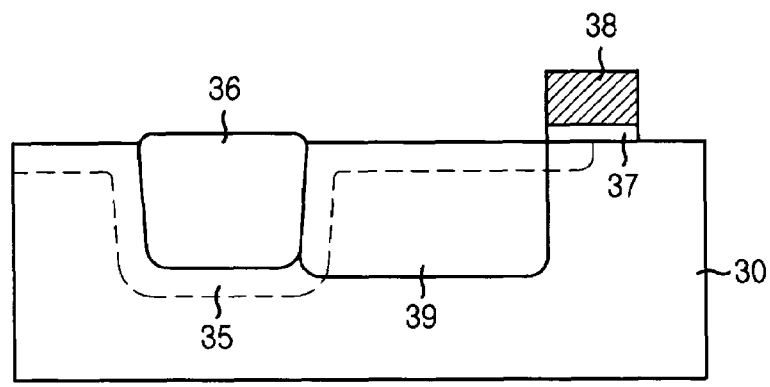
Figure 3C:
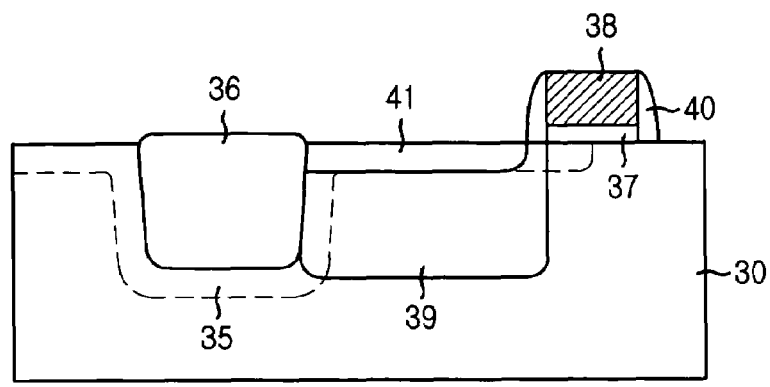

FIGS. 3A to 3C are cross-sectional views illustrating a method for fabricating a complementary metal oxide semiconductor (CMOS) image sensor in accordance with a preferred embodiment of the present invention. Only a photodiode and a native transistor region are shown in FIGS. 3A to 3C.

Referring to FIG. 3A, a pad oxide layer and a nitride layer are deposited on a p-type substrate 30 providing a p-type epitaxial layer and are patterned such that a partial portion of the p-type substrate 30 is exposed. From this patterning, a pad oxide layer pattern 31 and a hard mask 32 are formed. Herein, in consideration of a channeling phenomenon occurring during a subsequent ion-implantation process for forming an N-channel stop region, the hard mask 32 is formed with a predetermined thickness. Preferably, the predetermined thickness of the hard mask 32 is in a range from about 1450 Å to about 1900 Å. Hereinafter, the aforementioned ion-implantation process for forming the N-channel stop region is referred to as the N-channel stop ion-implantation process.

Next, the exposed substrate 30 is etched with use of the hard mask 32 to thereby form a trench 33 with a predetermined depth. Thereafter, a photoresist pattern 34 for opening a photodiode region of the p-type substrate 30 and a native N-channel metal oxide semiconductor (NMOS) transistor region is formed on an upper surface of the hard mask 32 by performing a photolithography process. With use of the photoresist pattern 34 as a mask, the N-channel stop ion-implantation process is performed with p-type impurity ions made to pass the hard mask 32 and eventually reach to the opened portion of the p-type substrate 30. Also, the N-channel stop ion-implantation process proceeds with four times of rotation in conjunction with respectively different angles of about 0 degree, about 90 degrees, about 180 degrees and about 270 degrees.

From the N-channel stop ion-implantation process, the channeling phenomenon is generated on a surface of the p-type substrate 30. Herein, high energy is used in the N-channel stop ion-implantation process to obtain such channeling phenomenon. Because of this N-channel stop ion-implantation process, a p-type ion impurity region 35 serving as the N-channel stop region of the native NMOS transistor and a first p0 impurity region of the photodiode is formed. Herein, the p-type impurity ions are boron ions. Preferably, the N-channel stop ion-implantation process uses a concentration of the boron ions in about $3.5 \times 10^{12} \times 4/cm^3$ and energy greater than about 30 KeV under consideration of the thicknesses of the hard mask 32 and the photoresist pattern 34. Preferably, the energy used in the N-channel stop ion-implantation process is in a range from about 35 KeV to about 50 KeV. Herein, the reason for notating the concentration of the boron ions as the above is to indicate that each ion-implantation process proceeds by giving four times of rotation with different angles of about 0 degree, about 90 degrees, about 180 degrees and about 270 degrees along with the use of a predetermined concentration of the boron ions, i.e., about $3.5 \times 10^{12}/cm^3$. The same notation for the ion-implantation concentration will be notated for such ion-implantation process hereinafter.

Referring to FIG. 3B, the photoresist pattern 34 is removed by employing the known technology. Then, an oxide layer is deposited on the above resulting structure until being filled into the trench 33. A chemical mechanical polishing (CMP) process is performed to planarize the deposited oxide layer. Afterwards, the hard mask 32 and the pad oxide layer pattern 31 are removed to thereby form a field oxide layer 36 with a shallow trench isolation (STI) structure. The field oxide layer 36 defines an active region of the native NMOS transistor. Subsequently, a gate insulation layer 37 and a gate 38 are sequentially formed on an active region of the p-type substrate 30. A deep $N^-$ impurity region 39 is formed in the photodiode region of the p-type substrate 30 by employing a first mask and a first ion-implantation processes both for forming the photodiode.

Referring to FIG. 3C, a gate spacer 40 is formed on sidewalls of the gate 38, and then, a second p0 impurity region 41 is formed on a surface of the deep $N^-$ impurity region 39 by performing a second ion-implantation process for forming the photodiode. After the second ion-implantation process, the p0 impurity region of the photodiode is completely formed. Herein, each ion-implantation process proceeds with four times of rotation with respectively different angles of about 0 degree, about 90 degrees, about 180 degrees and about 270 degrees. Also, in the second ion-implantation process, boron difluoride ($BF_2$) ions are ion-implanted preferably with a concentration of about $4.0 \times 10^{12} \times 4/cm^3$ by using implantation energy of about 30 KeV.

In accordance with the preferred embodiment of the present invention, the N-channel stop ion-implantation process proceeds with appropriately controlled implantation energy under consideration of the thicknesses of the hard mask and the photoresist pattern. With the appropriate control of the implantation energy, a channeling phenomenon is generated in the active region of the native NMOS transistor to thereby simultaneously form the fist p0 impurity region. As a result, it is possible to reduce the total number of the mask and the ion-implantation processes repeated for forming the photodiode. Eventually, this simplified mask and ion-implantation processes provides an effect of reducing manufacturing costs. Also, since the p-type impurity region, i.e., the N-channel stop region, is formed even in the active region of the native NMOS transistor, it is possible to improve characteristics of the native NMOS transistor related to a breakdown voltage and leakage currents.

While the present invention has been described with respect to certain preferred embodiments, it will be apparent to those skilled in the art that various changes and modifications may be made without departing from the scope of the invention as defined in the following claims.

What is claimed is:

1. A method for fabricating a complementary metal oxide semiconductor (CMOS) image sensor, comprising:

forming a substrate of a first conductive type defined with a photodiode region and a native second conductive channel transistor region; and forming a first conductive type impurity region by performing an ion-implantation process for forming a second conductive type channel stop region with a first conductive impurity ion, wherein the first conductive type impurity region is extended to a photodiode region and the native second conductive type channel transistor region.

2. The method as recited in claim 1, wherein the first conductive type impurity region serves as one conductive type impurity region of the photodiode and the second conductive type channel stop region.

3. The method as recited in claim 2, wherein the forming the first conductive type impurity region includes:
forming a pad oxide layer and a hard mask on the substrate, the pad oxide layer and the hard mask exposing a partial portion of the substrate; and
etching the exposed partial portion of the substrate to form a trench with a predetermine depth.

4. The method as recited in claim 3, wherein the thickness of the hard mask ranges from about 1450 Å to about 1900 Å.

5. The method as recited in claim 1, wherein the first conductive type is a P-type and the second conductive type is an N-type.

6. The method as recited in claim 1, wherein the ion-implantation process for forming the second conductive type channel stop region proceeds by using energy greater than about 30 KeV.

7. The method as recited in claim 6, wherein the ion-implantation process for forming the second conductive type channel stop region proceeds by using energy ranging from about 35 KeV to about 50 KeV.

8. The method as recited in claim 6, wherein the ion-implantation process for forming the second conductive type channel stop region proceeds by using boron ions.

9. The method as recited in claim 8, wherein the boron ions are ion-implanted with a concentration of about $3.5 \times 10^{12} \times 4/cm^3$.

10. The method as recited in claim 6, wherein the ion-implantation process for forming the second conductive type channel stop region proceeds by giving four times of rotation with different angles of about 0 degree, about 90 degrees, about 180 degrees and about 270 degrees.

* * * * *